United States Patent
Callegari et al.

(10) Patent No.: US 7,521,346 B2
(45) Date of Patent: Apr. 21, 2009

(54) METHOD OF FORMING HFSIN METAL FOR N-FET APPLICATIONS

(75) Inventors: Alessandro C. Callegari, Yorktown Heights, NY (US); Martin M. Frank, New York, NY (US); Rajarao Jammy, Hopewell Junction, NY (US); Dianne L. Lacey, Mahopac, NY (US); Fenton R. McFeely, Ossining, NY (US); Sufi Zafar, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/875,524

(22) Filed: Oct. 19, 2007

(65) Prior Publication Data

US 2008/0038905 A1 Feb. 14, 2008

Related U.S. Application Data

(62) Division of application No. 11/035,369, filed on Jan. 13, 2005, now abandoned.

(51) Int. Cl.
*H01L 21/4763* (2006.01)
(52) U.S. Cl. .................. 438/592; 438/591; 438/648; 438/685; 257/411; 257/412
(58) Field of Classification Search ......... 257/410–412; 438/591, 261, 585, 588, 592, 648, 656, 683, 438/685
See application file for complete search history.

(56) References Cited

U.S. PATENT DOCUMENTS

| | | | |
|---|---|---|---|
| 6,413,386 B1 * | 7/2002 | Callegari et al. | ....... 204/192.23 |
| 6,974,779 B2 | 12/2005 | O'Meara et al. | |
| 2004/0161883 A1 | 8/2004 | Colombo et al. | |
| 2004/0222443 A1 | 11/2004 | Rotondaro et al. | |
| 2005/0026459 A1 | 2/2005 | O'Meara et al. | |
| 2005/0059259 A1 | 3/2005 | O'Meara et al. | |
| 2005/0199877 A1 | 9/2005 | Dip et al. | |
| 2005/0236678 A1 | 10/2005 | Sato et al. | |
| 2005/0258500 A1 | 11/2005 | Colombo et al. | |
| 2006/0065938 A1 | 3/2006 | Ko et al. | |
| 2006/0068603 A1 | 3/2006 | Wajda | |
| 2006/0125026 A1 | 6/2006 | Li et al. | |
| 2006/0131652 A1 | 6/2006 | Li | |

* cited by examiner

*Primary Examiner*—Phat X Cao
*Assistant Examiner*—Abul Kalam
(74) *Attorney, Agent, or Firm*—Scully, Scott, Murphy & Presser, P.C.; Ido Tuchman, Esq.

(57) ABSTRACT

A compound metal comprising HfSiN which is a n-type metal having a workfunction of about 4.0 to about 4.5, preferably about 4.3, eV which is thermally stable on a gate stack comprising a high k dielectric and an interfacial layer. Furthermore, after annealing the stack of HfSiN/high k dielectric/interfacial layer at a high temperature (on the order of about 1000° C.), there is a reduction of the interfacial layer, thus the gate stack produces a very small equivalent oxide thickness (12 Å classical), which cannot be achieved using TaSiN.

1 Claim, 6 Drawing Sheets

METHOD OF FORMING HFSIN METAL FOR N-FET APPLICATIONS

RELATED APPLICATION

This application is a divisional application of U.S. patent application Ser. No. 11/035,369, filed Jan. 13, 2005.

FIELD OF THE INVENTION

The present invention relates to a semiconductor device and a method of fabricating the same. More particularly, the present invention relates to a complementary metal oxide semiconductor (CMOS) device which includes a thermally stable n-type metal on a high dielectric constant, k/interfacial layer stack. The present invention also provides a process for forming the thermally stable n-type metal which can be integrated with a CMOS processing flow.

BACKGROUND OF THE INVENTION

In standard CMOS devices, polysilicon is typically the standard gate material. The technology of fabricating CMOS devices using polysilicon gates has been in a constant state of development, and is now widely used in the semiconductor industry. One advantage of using polysilicon gates is that they can sustain high temperatures. However, there are also some problems associated with using a polysilicon gate. For example, due to the poly-depletion effect and relative high electrical sheet resistance (approximately 150 Ohms/Sq.), polySi gates commonly used in CMOS devices are becoming a gating factor in chip performance for channel lengths of 0.1 micron and below. Another problem with polySi gates is that the dopant in the polySi gate, such as boron, can easily diffuse through the thin gate dielectric causing further degradation of the device performance.

In order to avoid the problems with polySi gates, it has been suggested to replace the polySi gate with a single metal. Metals with different workfunctions, one for pFETs and one for nFETs are required for CMOS technologies using a high k dielectric. Metal/high k dielectric stacks also have to be subjected to a high temperature (on the order of about 1000° C.) anneals required for the source/drain self-aligned implant activation. Gate stack reactions occur during this high temperature anneal limiting the choice of materials. For example, in gate stacks including W and a high k dielectric, $SiO_2$ regrowth occurs at the interface limiting inversion layer scalability. See, for example, A. Callegari, et al. IEDM 2004, p. 825, S. Francisco Calif., Dec. 13-15, 2004.

Metal compounds may be more stable, but still have problems with targeting the right workfunction. For example, TaSiN has been proposed as a nFET candidate, but still there are some questions about its workfunction and mobility reduction is observed in nFET devices. Furthermore, it appears that the inversion thickness scability is somewhat limited using TaSiN.

In view of the above, there is a need for providing a new compound metal which is thermally stable on a gate stack including a high k dielectric. In particular, there is a need for providing a new compound metal useful in nFET devices.

SUMMARY OF THE INVENTION

The present invention provides a new compound metal comprising HfSiN which is a n-type metal having a workfunction of about 3.7 to about 4.5 eV, preferably about 4.0, eV which is thermally stable on a gate stack comprising a high k dielectric and an interfacial layer. Furthermore, after annealing the stack of HfSiN/high k dielectric/interfacial layer at a high temperature (on the order of about 1000° C.), there is a reduction of the interfacial layer, thus the gate stack produces a very small equivalent oxide thickness (12 Å classical), which cannot be achieved using TaSiN.

In broad terms, the present invention provides a semiconductor structure, i.e., film stack, which comprises:
a semiconductor substrate;
an interfacial layer located on said semiconductor substrate;
a high k dielectric located on said interfacial layer; and
a HfSiN gate metal located on said high k dielectric.

Additionally, the present invention provides a semiconductor structure that comprises:
a semiconductor substrate, and
a patterned gate region comprising at least an interfacial layer located on a portion of said substrate, a high k dielectric located on said interfacial layer, and a HfSiN metal located on said high gate dielectric.

In addition to the film stack and the semiconductor structure described above, the present invention also provides a method of fabricating a HfSiN metal compound that comprises:
providing a Hf target and an atmosphere that comprises $Ar/N_2$/a Si source, said Si source is diluted with He; and
sputtering a HfSiN film from said Hf target in said atmosphere.

In accordance with the present invention, the Si source diluted with He, which limits the Si source reactivity, improves the quality of the film. The resistivities of the HfSiN film can vary depending on the concentration of the process gases. Typically, the higher the nitrogen and/or Si concentrations, the higher the resistivity.

The present invention also provides a method of fabricating the semiconductor structure described above in which the inventive process for forming a HfSiN film is employed. In general terms, the semiconductor structure is formed by first providing a stack comprising a high k dielectric and an interfacial layer on a surface of a substrate; and thereafter forming a HfSiN film on said stack utilizing the processing steps mentioned above, i.e., by providing a Hf target and an atmosphere that comprises $Ar/N_2$/a Si source that is diluted with He; and sputtering a HfSiN film from said Hf target in said atmosphere.

In some embodiments of the present invention, the HfSiN metal gate can be used alone as the gate electrode, or in conjunction with a Si-containing gate electrode that includes a silicide contact on an upper surface thereof. The later structure is referred to herein as a dual polySi/HfSiN-containing FET.

It is noted that the term high k dielectric is used throughout the present application to denote an insulator material whose dielectric constant k, is greater than $SiO_2$, e.g., greater than 4.0. Preferably, the high k dielectric has a k that is about 7.0 or greater.

The term "interfacial layer" is used throughout the present application to denote an insulator material that comprises atoms of at least Si or O including, for example, $SiO_2$, and SiON.

DETAILED DISCUSSION OF THE INVENTION

Figure 1A:
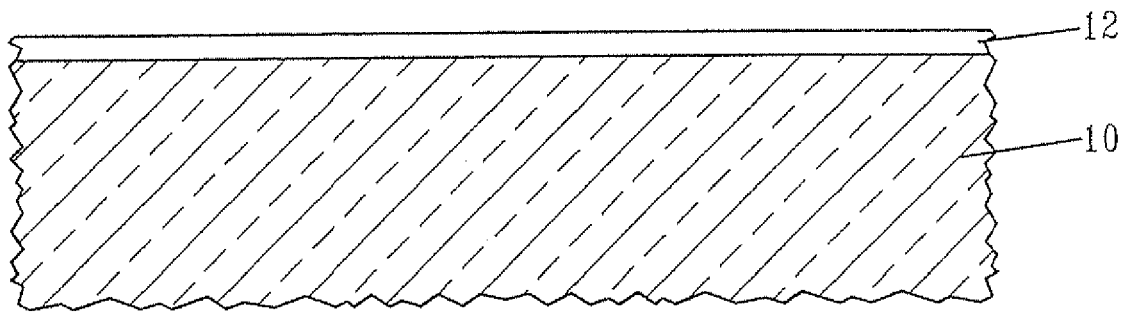
FIGS. 1A-1C are pictorial representations (through cross sectional views) illustrating the various processing steps used in forming a film stack structure which includes the HfSiN metal compound as a n-type metal gate on a stack comprising a high k dielectric and an interfacial layer.

The present invention, which provides a HfSiN compound metal that can be used as a thermally stable n-metal gate on a stack comprising a high k dielectric and an interfacial layer as well as a method of fabricating the same, will now be described in greater detail by referring to the drawings that accompany the present application. It is noted that the drawings of the present invention are provided for illustrative purposes and thus they are not drawn to scale.

Figure 1B:
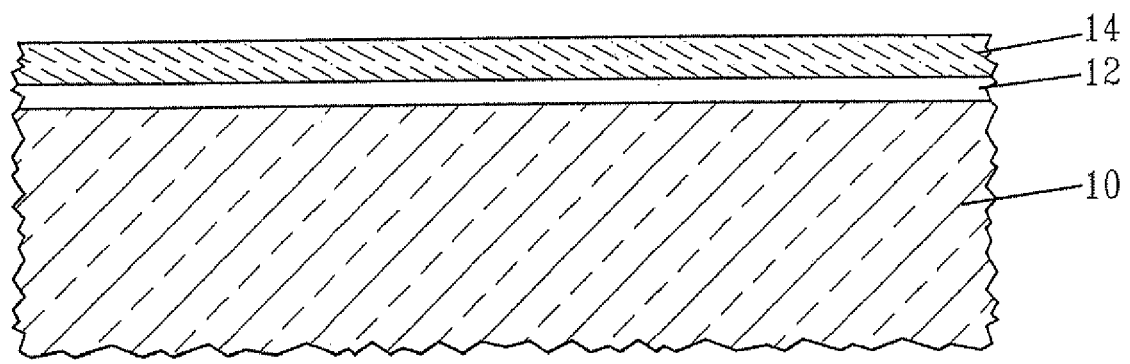
Figure 1C:
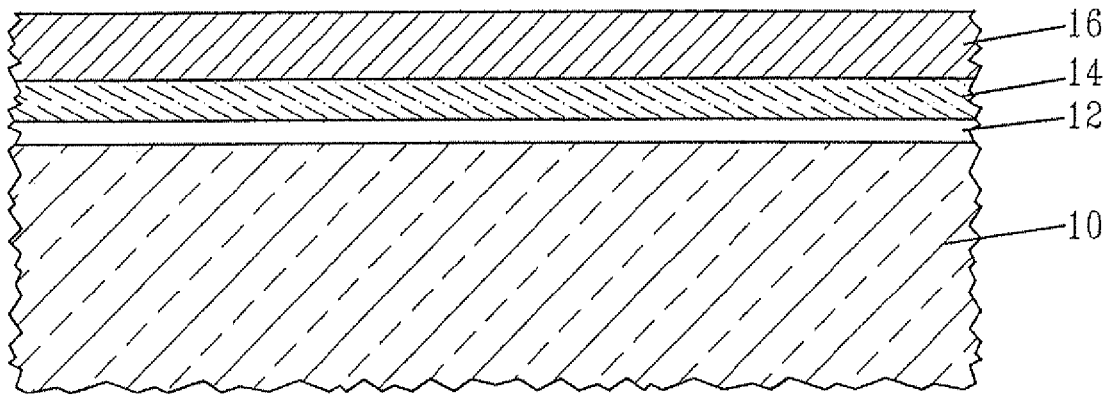

Reference is first made to FIGS. 1A-1C which illustrate basic processing steps that are used in forming a film stack structure that includes the inventive HfSiN compound metal on a stack containing a high k dielectric and an interfacial layer. FIG. 1A shows an initial film stack structure that includes an interfacial layer 12 on a surface of a semiconductor substrate 10.

The semiconductor substrate 10 employed in the present invention comprises any semiconducting material including, but not limited to: Si, Ge, SiGe, SiC, SiGeC, Ga, GaAs, InAs, InP and all other IV/IV, III/V, or II/VI compound semiconductors. Semiconductor substrate 10 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 10 be composed of a Si-containing semiconductor material, i.e., a semiconductor material that includes silicon. The semiconductor substrate 10 may be doped, undoped or contain doped and undoped regions therein.

The semiconductor substrate 10 may also include a first doped (n- or p-) region, and a second doped (n- or p-) region. For clarity, the doped regions are not specifically shown in the drawings of the present application. The first doped region and the second doped region may be the same, or they may have different conductivities and/or doping concentrations. These doped regions are known as "wells". The semiconductor substrate 10 may be strained, unstrained or a combination thereof. Moreover, the semiconductor substrate 10 may have any crystallographic orientation including, for example, 100, 110, 111 or a combination thereof. Alternatively, the semiconductor substrate 10 may be a hybrid substrate that includes at least two planar surfaces of different crystallographic orientation.

At least one isolation region (not shown) is then typically formed into the semiconductor substrate 10. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities. The neighboring gate regions can have the same conductivity (i.e., both n- or p-type), or alternatively they can have different conductivities (i.e., one n-type and the other p-type).

Interfacial layer 12 is then formed atop the surface of the semiconductor substrate 10 utilizing a thermal process such as oxidation or oxynitridation, a deposition process such as chemical vapor deposition (CVD), plasma-assisted CVD, atomic layer deposition (ALD), evaporation, sputtering, and chemical solution deposition, or a combination thereof. Alternatively, a deposition process and nitridation can be used to form the interfacial layer 12. The interfacial layer 12 comprising atoms of at least Si and O, with N being optional. The interfacial layer 12 thus may comprise $SiO_2$, SiON, silicates thereof, or multilayers thereof. In some embodiments, the interfacial layer 12 comprises $SiO_2$, while in other embodiments the interfacial layer 12 comprises SiON. The interfacial layer 12 comprises from about 1 to about 80, typically from about 1 to about 30, atomic percent Si. The remaining is O and/or N. The Si can be continuously present throughout the interfacial layer 12 or it can be graded.

The interfacial layer 12 typically has a dielectric constant from about 4.0 to about 20, with a dielectric constant from about 4.5 to about 18 being even more typical. The interfacial layer 12 typically has a thickness from about 0.1 to about 5 nm, with a thickness from about 0.2 to about 2.5 nm being more typical.

Next, and as shown in FIG. 1B, a high k dielectric 14 is formed on a surface of the interfacial layer 12. The term "high k" denotes an insulator whose dielectric constant is greater than 4.0, typically from about 7.0 or greater. The high k dielectric 14 can be formed by a thermal growth process such as, for example, oxidation, nitridation or oxynitridation. Alternatively, the high k dielectric 14 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The dielectric 14 may also be formed utilizing any combination of the above processes.

Illustratively, the high k dielectric 14 employed in the present invention includes, but is not limited to: an oxide, nitride, oxynitride, and/or silicate (including metal silicates and nitrided metal silicates). In one embodiment, it is preferred that the high k dielectric 14 is comprised of an oxide such as, for example, $HfO_2$, $ZrO_2$, $Al_2O_3$, $TiO_2$, $La_2O_3$, $SrTiO_3$, $LaAlO_3$, $Y_2O_3$, $Ga_2O_3$, GdGaO and mixtures thereof. Highly preferred examples of the high k dielectric 14 include $HfO_2$, hafnium silicate or hafnium silicon oxynitride.

The physical thickness of the high k dielectric 14 may vary, but typically, the high k dielectric 14 has a thickness from about 0.5 to about 10 nm, with a thickness from about 0.5 to about 3 nm being more typical.

After providing the stacked structure shown in FIG. 1B, a HfSiN compound metal layer 16 is then formed atop the high k dielectric 14 providing the structure shown, for example, in FIG. 1C. In accordance with the present invention, the HfSiN compound metal layer 16 is formed by providing a Hf target and an atmosphere that comprises $Ar/N_2/Si$ source diluted in He and then sputtering a HfSiN film from said Hf target in said atmosphere. The sputtering process occurs in a reactor chamber of any conventional sputtering apparatus. As mentioned above, the He is used to dilute the Si source. Typically, the amount of He used to dilute the Si source is from about 70 to about 99%, with an amount of He of about 95 to about 99% being even more typical. In some embodiments, the Si source contains 98% He.

The Hf target used in the present invention includes any solid source of Hf. The silicon, Si source used in the atmosphere during the sputtering of the HfSiN film includes any organic containing Si compound including for example, $SiH_{4-n}R_n$ wherein n is 0, 1, 2, 3, or 4, and R is an aliphatic moiety (i.e., alkane, alkene, alkyne or a combination thereof) containing from 1 to about 18, preferably from about 1 to about 8 carbon atoms. The aliphatic moiety can be straight chain or branched. Preferably, n is 0 and the Si source is $SiH_4$. The source of Si can be a solid, liquid or gas, with gaseous Si sources being highly preferred.

The flow ratio of Ar/N2/Si source employed in the present invention is from about 1-100/1-100/1-100 sccm, respectively, with a flow ratio from about 10-20/5-15/10-30 sccm being even more typical. In some preferred embodiments, the flow ratio of $Ar/N_2$/Si source from about 5/5/5 sccm to about 50/50/50 sccm, respectively can be employed.

The other sputtering conditions such as temperature, pressure and time are conventional and are well known to those skilled in the art.

As indicated above, the resistivity of the HfSiN film depends on the concentration of the process gases; the higher the nitrogen and/or Si concentration the higher the resistivity of the HfSiN film 16. Typically, the resistivity of the HfSiN film is about 105 micro-ohm/cm or less, with a resistivity from about 100 to about 130 micro-ohm/cm being even more typical.

The thickness of the HfSiN film 16 formed may vary depending on the sputtering conditions used and the type of device to be fabricated. Typically, the HfSiN film 16 has a thickness, after sputtering, from about 2 to about 200 nm, with a thickness from about 5 to about 40 nm being even more typical.

The structure shown in FIG. 1C can then be formed into a CMOS device, e.g., FET, utilizing any conventional CMOS processing flow. In some embodiments, the stacked structure shown in FIG. 1C can be processed as is, or alternatively, a Si-containing gate material 18 can be formed on top of the HfSiN layer 16. The later embodiment is shown in FIG. 2A-2D. Although FIGS. 2A-2D illustrate the presence of the Si-containing material 18, the following processing steps can generally work when no Si-containing material is formed. Note that the subsequent silicidation of the patterned gate region 20 including only the HfSiN layer 16 is typically not performed.

Figure 2A:
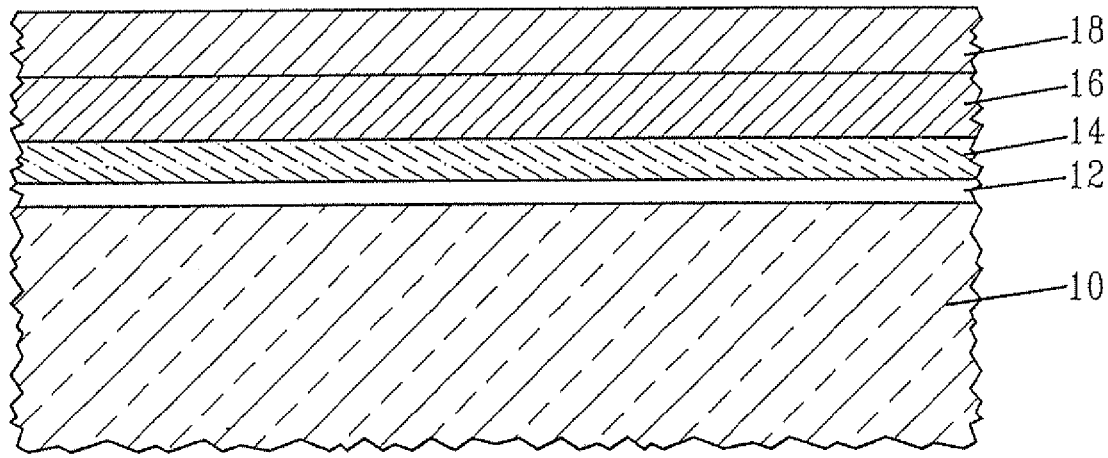
FIGS. 2A-2D are pictorial representations (through cross sectional views) illustrating the basic processing steps of the present invention for forming a polySi/gate metal self-aligned FET structure.

In the embodiment illustrated in FIG. 2A, a Si-containing material 18 such as polysilicon, SiGe and SiGeC is formed atop the HfSiN layer 16. Thus, in this embodiment the Si-containing material 18 and the HfSiN layer 16 form a multilayered gate. In another embodiment, the HfSiN is used as a single metal gate. The Si-containing material 18 used is in either single crystal, polycrystalline or amorphous, or consists of mixtures of such forms.

The Si-containing material is typically doped utilizing an in-situ deposition process or by deposition, ion implantation and annealing. The dopant is a n-type dopant since HfSiN is a n-type metal. The thickness, i.e., height, of the Si-containing material 18 formed at this point of the present invention may vary depending on the process employed. Typically, the Si-containing material has a vertical thickness from about 20 to about 180 nm, with a thickness from about 40 to about 150 nm being more typical.

Figure 2B:
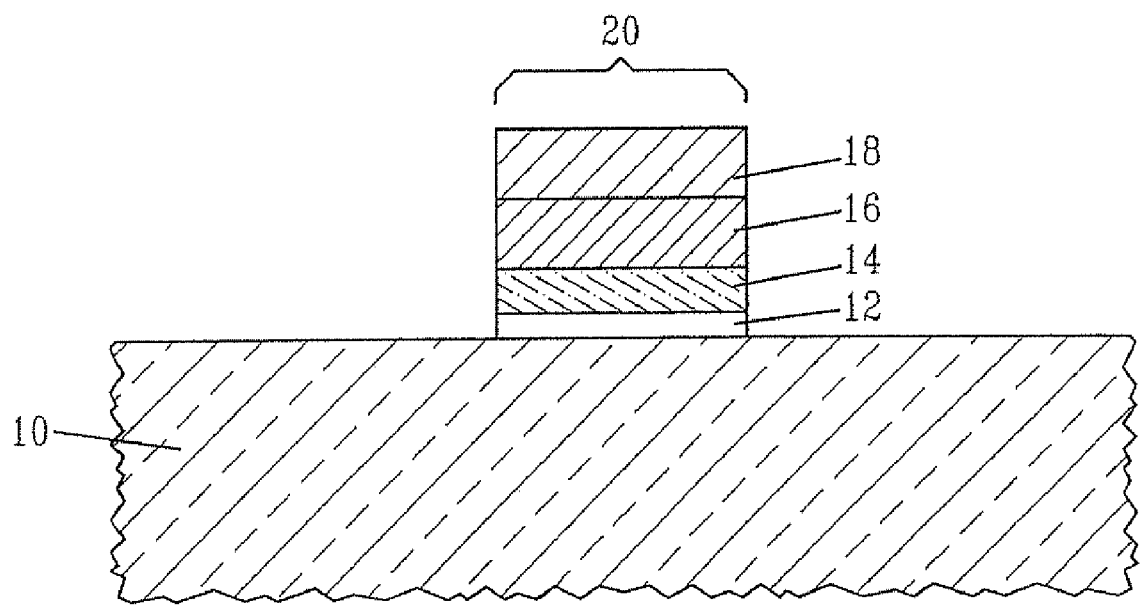

In the processing embodiment illustrated, the Si-containing material 18, the HfSiN layer 16, and optionally the high k dielectric 14 and the interfacial layer 12 are then patterned by lithography and etching so as to provide a patterned gate region or stack 20. Although a single patterned gate region (or stack) 20 is shown, the present invention contemplates forming a plurality of patterned gate regions (or stacks) 20. When a plurality of patterned gate regions (or stacks) are formed, the gate regions (or stacks) may have the same dimension, i.e., length, or they can have variable dimensions to improve device performance. Each patterned gate stack (or region) 20 at this point of the present invention includes at least a patterned HfSiN layer 16. FIG. 2B shows the structure after pattern gate region (or stack) 20 formation. In the illustrated embodiment, the Si-containing material 18, the HfSiN layer 16, the high k dielectric 14 and the interfacial layer 12 are etched, i.e., patterned, during this step of the present invention.

The lithographic step includes applying a photoresist to the upper surface of the blanket layered structure shown in either FIG. 2A or FIG. 1C, exposing the photoresist to a desired pattern of radiation and developing the exposed photoresist utilizing a conventional resist developer. The pattern in the photoresist is then transferred to the structure utilizing one or more dry etching steps. In some embodiments, the patterned photoresist may be removed after the pattern has been transferred into one of the layers of the blanket layered structure. In other embodiments, the patterned photoresist is removed after etching has been completed.

Suitable dry etching processes that can be used in the present invention in forming the patterned gate region (or stack) 20 include, but are not limited to: reactive ion etching, ion beam etching, plasma etching or laser ablation. The dry etching process employed is typically, but not always, selective to the underlying high k dielectric 14 therefore this etching step does not typically remove the stack containing the high k dielectric 14 and the interfacial layer 12. In some embodiments and as shown in FIG. 2B, this etching step may however be used to remove portions of the high k dielectric 14 and the interfacial layer 12 that are not protected by the material layers of the gate region (or stack) that were previously etched.

Figure 2C:
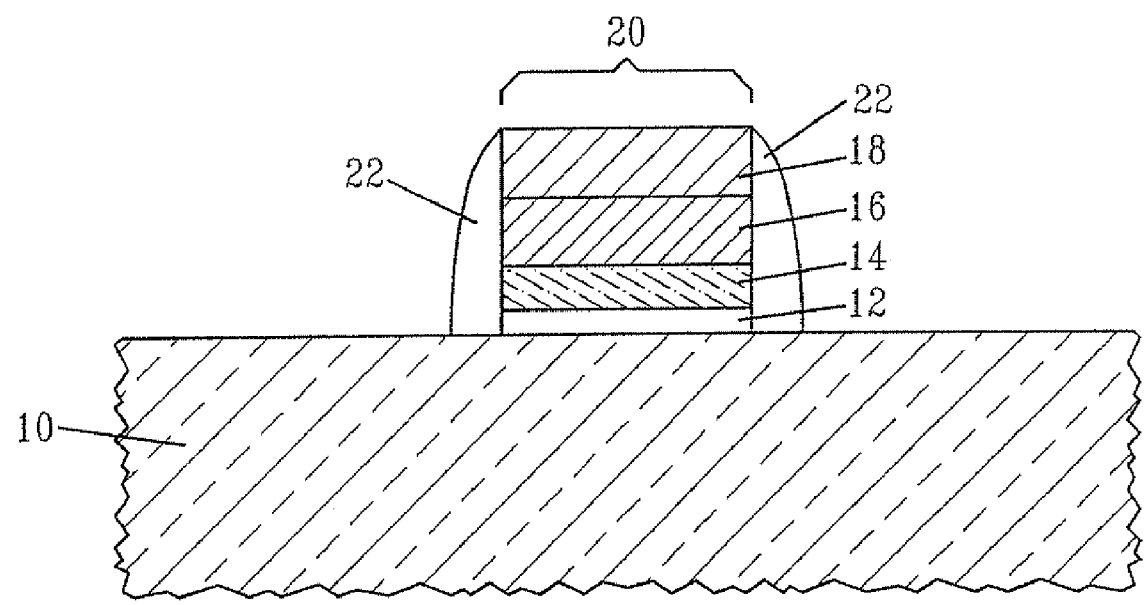

Next, at least one spacer 22 is typically, but not always, formed on exposed sidewalls of each patterned gate region (or stack) 20, see, for example, FIG. 2C. The at least one spacer 22 is comprised of an insulator such as an oxide, nitride, oxynitride and/or any combination thereof. The at least one spacer 22 is formed by deposition and etching.

The width of the at least one spacer 22 must be sufficiently wide such that the source and drain silicide contacts (to be subsequently formed) do not encroach underneath the edges of the gate region (or stack) 20. Typically, the source/drain silicide does not encroach underneath the edges of the gate region (or stack) 20 when the at least one spacer 22 has a width, as measured at the bottom, from about 20 to about 80 nm.

The gate region (or stack) 20 can also be passivated prior to spacer formation by subjecting the same to a thermal oxidation, nitridation or oxynitridation process. The passivation step forms a thin layer of passivating material (not shown) about the gate region (or stack) 20. This step may be used instead or in conjunction with the previous step of spacer formation. When used with the spacer formation step, spacer formation occurs after the gate region (or stack) 20 passivation process.

Source/drain diffusion regions 24 (with or without the spacers present) are then formed into the substrate. The source/drain diffusion regions 24 are formed utilizing ion implantation and an annealing step. The annealing step serves to activate the dopants that were implanted by the previous implant step. The conditions for the ion implantation and annealing are well known to those skilled in the art. The structure formed after ion implantation and annealing is shown in FIG. 2D.

The source/drain diffusion regions 24 may also include extension implant regions (not separately labeled) which are formed prior to source/drain implantation using a conventional extension implant. The extension implant may be followed by an activation anneal, or alternatively the dopants implanted during the extension implant and the source/drain implant can be activated using the same activation anneal cycle. Halo implants (not shown) are also contemplated herein. The source/drain extensions are typically shallower than the deep source/drain regions and they include an edge that is aligned with an edge of the patterned gate region (or stack) 20.

Next, and if not previously removed, the exposed portion of the high k dielectric 14 and the underlying interfacial layer 12 are removed utilizing a chemical etching process that selectively removes these insulating materials. This etching step stops on an upper surface of the semiconductor substrate 10. Although any chemical etchant may be used in removing the exposed portions of the high k dielectric 14 and the underlying interfacial layer 12, in one embodiment dilute hydrofluoric acid (DHF) is used.

Figure 2D:
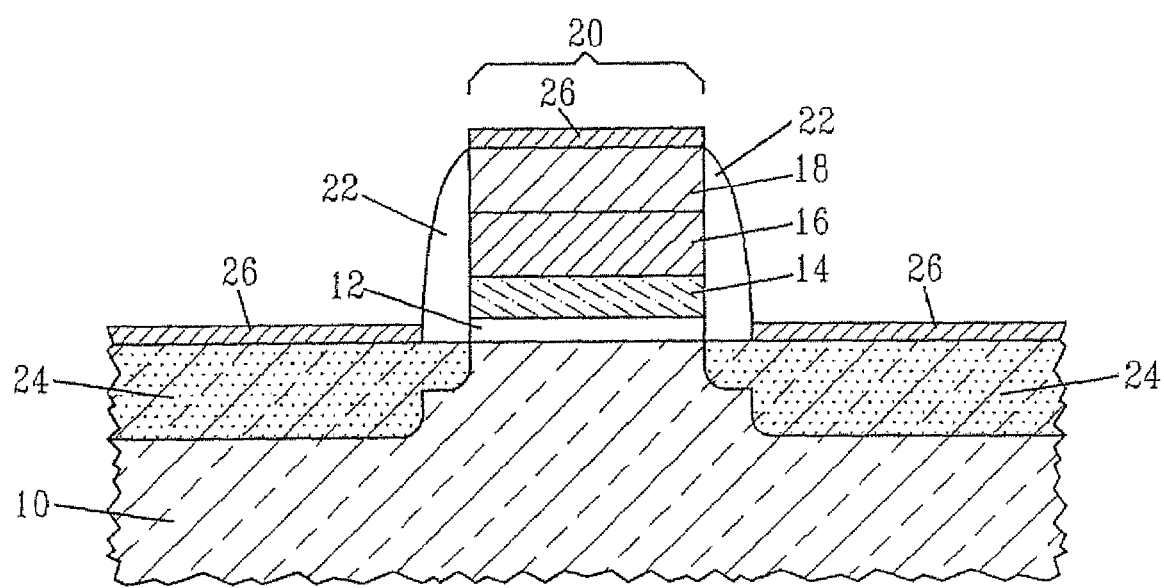

FIG. 2D also shows the presence of silicide regions 26 atop the source/drain diffusion regions 24 and, if present, the Si-containing material 18. The silicide atop the Si-containing material 18 is optional and is not formed if no Si-containing material is present on top of the gate region (or stack 20). The silicide regions 26 are formed utilizing any conventional silicidation process. In some embodiments and when no Si-containing material is present on at least the source/drain regions 26, a Si-containing material, such as epitaxial Si or amorphous Si, can be formed prior to silicidation.

The silicidation process comprises forming a conductive and refractory metal such as Co, Ti, W, Ni, Pt or alloys thereof with other alloying additives, such as C, Ge, Si, and etc., on top of the area to be silicided. A conventional deposition process, such as CVD, PECVD, sputtering, evaporation or plating, can be used. Optionally, a barrier layer may be formed over the metal layer that protects the metal from oxidation. Examples of optional barrier layers include, for example, SiN, TiN, TaN, TiON and combinations thereof. Following metal deposition the structure is subjected to at least a first anneal that causes reaction between the deposited metal and Si and subsequent formation of a metal silicide. The annealing is typically performed at a temperature from about 250° to about 800° C., with a first annealing temperature from about 400° to about 550° C. being more typical.

In some embodiments, the first anneal forms a metal rich silicide phase, which is highly resistant to a selective etch process. When a metal rich phase is produced, a second higher temperature anneal is required to form a low resistivity silicide. In other embodiments, the first anneal is sufficient in forming the low resistivity silicide.

Following the first anneal, the unreacted and remaining portions of the deposited metal are removed using a conventional etch process, such as wet etching, reactive-ion etching (RIE), ion beam etching, or plasma etching.

If needed, a second anneal is performed after the etching process. The second annealing is typically performed at higher temperatures than the first annealing. A typical temperature range for the second, optional, anneal is from about 550° to about 900° C.

Further CMOS processing such as the formation of BEOL (back-end-of-the-line) interconnect levels with metal interconnects can be formed utilizing processing steps that are well known to those skilled in the art.

The following example provides an illustration of the inventive process as well as some advantages that can be obtained from using the same in forming a HfSiN-containing gate stack.

EXAMPLE

Figure 3:
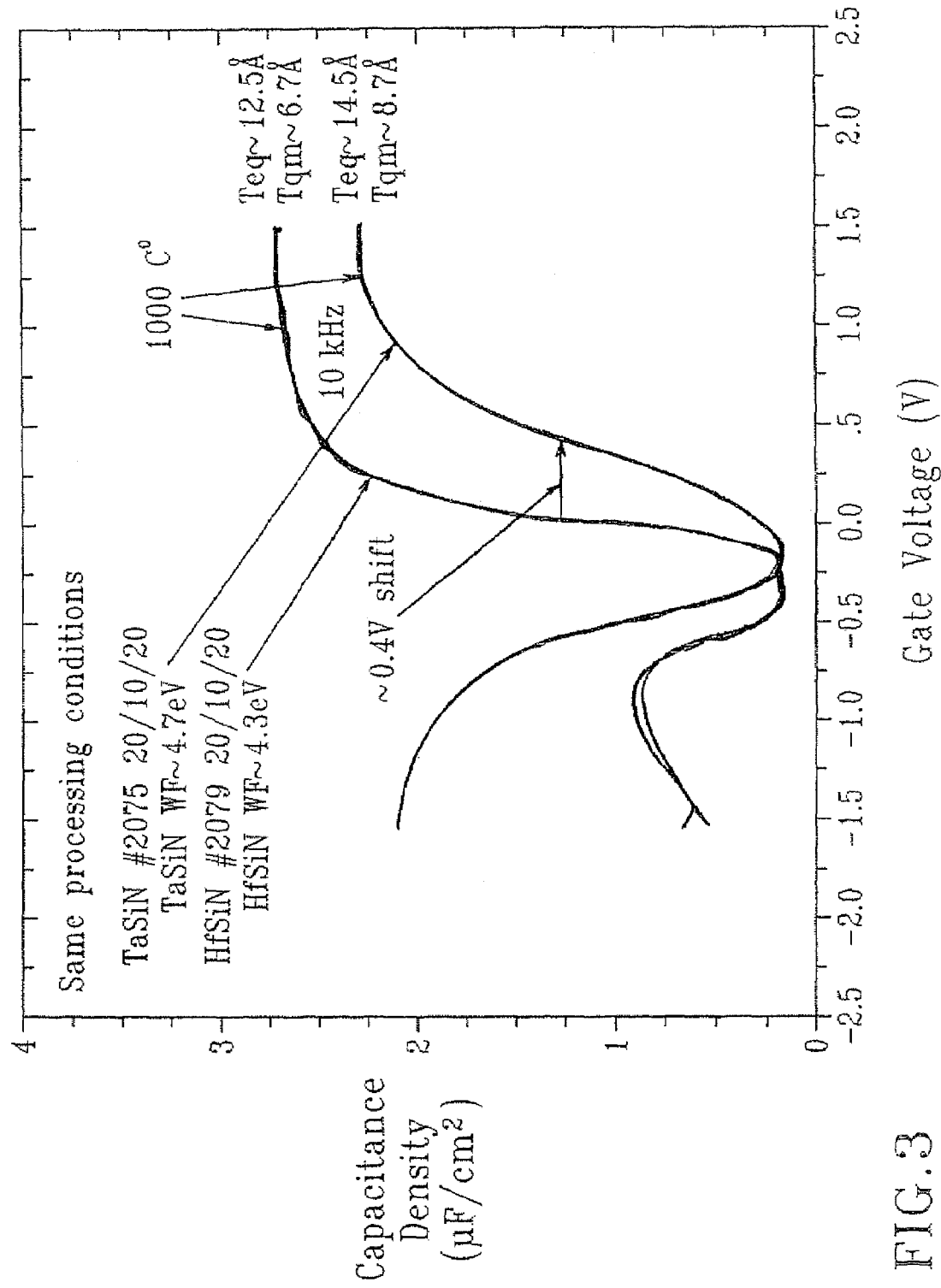
FIG. 3 shows capacitance-voltage (CV, n-substrate) characteristics of HfSiN compared with TaSiN in a similar process on the same gate stack; 30 Å $HfO_2/SiO_2$. Note that the HfSiN has a workfunction of about 4.3 eV (nFET) compared with a 4.7 eV for TaSiN (mid-gap).

In this example, a $HfSiN/HfO_2/SiO_2$ stack was formed on a surface of a Si wafer. The $SiO_2$ interfacial layer was formed by oxidation of the Si wafer. The thickness of the $SiO_2$ interfacial layer was about 1 nm. A $HfO_2$ dielectric having a thickness of about 3 nm was then formed on the $SiO_2$ interfacial layer by ALD. The HfSiN layer was then formed by providing a Hf target and an atmosphere comprising $Ar/N_2/SiH_4$ (2% in He) in which flow ratio of $Ar:N_2:SiH_4$ (2% in He) was 20:10:20 sccm, respectively. The HfSiN layer had a thickness of about 40 nm. After providing the stack, the stack was subjected to a 1000° C. anneal, followed by a forming gas anneal that was performed at 450° C. For comparison, a TaSiN compound metal was formed about a similar $HfO_2/SiO_2$ stack. FIG. 3 shows the CV characteristics at 10 kHz of these stacks on a n-substrate. Note that the workfunction for the stack containing HfSiN was about 4.3 eV which is typical for a nMOS device, while the TaSiN-containing stack had a workfunction of about 4.7 eV (mid-gap). Workfunction were calculated according to S. M. Sze, Physics of Semiconductor Devices, Second Edition, pages 395-397, J. Wiley & Sons. Also, notice that the equivalent oxide thickness of the stack containing HfSiN was only about 12 Å. Thus, the nFET fabricated using this stack should operate at an inversion layer thickness of about 12 Å with substantial gate leakage reduction because of the high k dielectric implemented in the gate stack. Current $SiO_2$ technology has an inversion layer thickness of about 19 Å with a much higher gate leakage.

Figure 4:
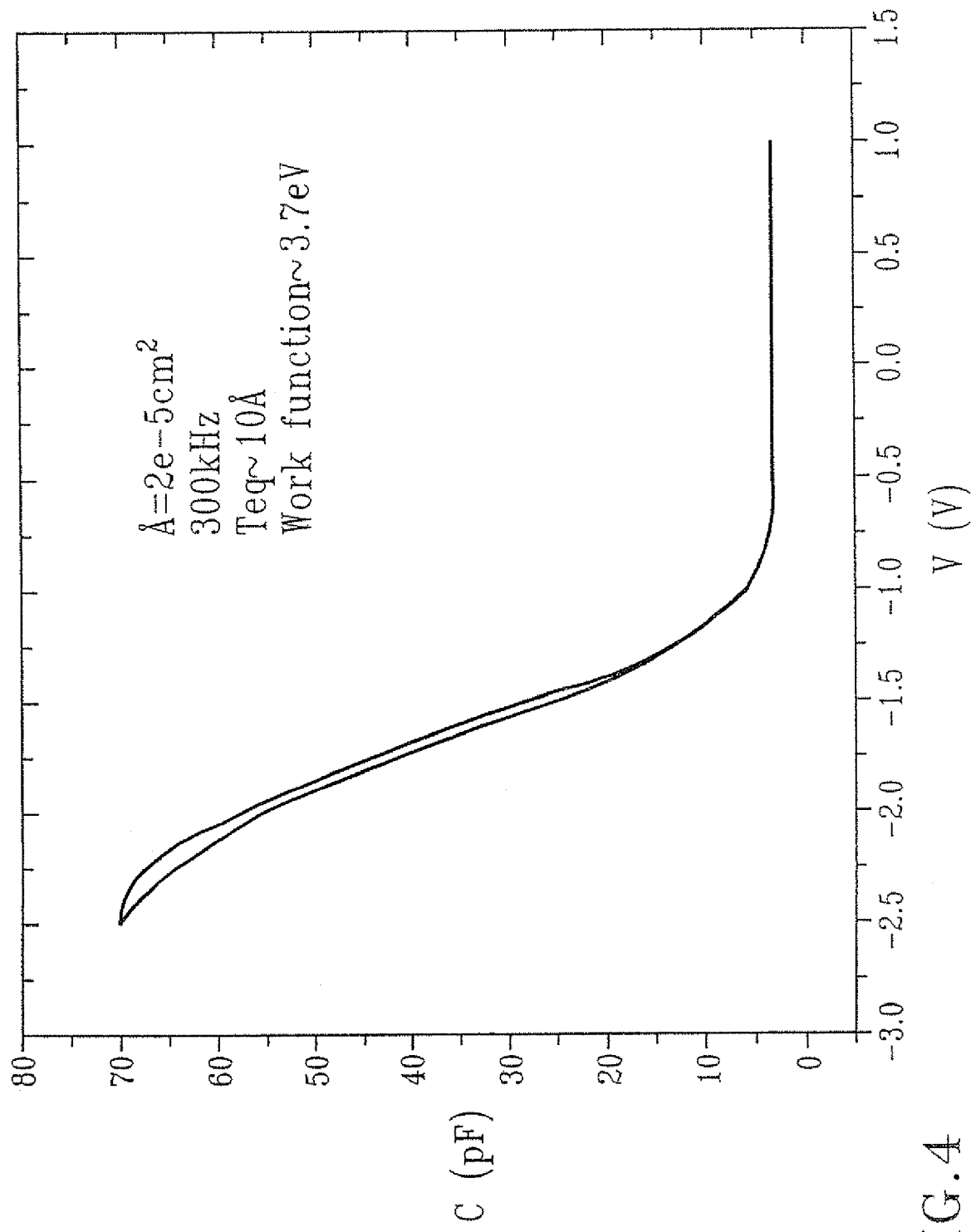
FIG. 4 shows capacitance-voltage (CV, p-substrate) characteristics of HfSiN on a $HfO_2/SiO_2$ stack annealed at 1000° C. and then annealed in a forming gas ambient at 450° C. Workfunction is about 3.7 eV.

FIG. 4 shows again a CV characteristic taken at 300 kHz of a $HfSiN/HfO_2/SiO_2$ gate stack on a p-substrate. The gate stack is similar to the one shown in FIG. 3, except for the $HfO_2$ (3 nm) which was deposited by MOCVD. The stack was rapid annealed at 1000° C. in $N_2$ for 5 s and then annealed in a forming gas ambient at 450° C. In this case workfunction, calculated according to S. M. Sze, Physics of Semiconductor Devices, Second Edition, pages 395-397, J. Wiley & Sons, is about 3.7 eV. This shows again n-FET behavior for the HfSiN.

While the present invention has been particularly shown and described with respect to preferred embodiments thereof it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:

providing a stack comprising, from top to bottom, a Hf oxide high k dielectric and an interfacial layer on a surface of a substrate;

forming a HfSiN film on said stack, wherein said HfSiN film is formed by providing a Hf target and an atmosphere that comprises a mixture of Ar, $N_2$, and a Si source diluted with from about 70 to 99% He and sputtering said HfSiN film from said Hf target in said atmosphere, wherein said Si source has the formula $SiH_{4-n}R_n$ wherein n is 0, 1, 2, 3 or 4 and R is an aliphatic moiety containing from 1 to about 18 carbon atoms and the mixture of Ar, $N_2$, and Si source has a flow rate from about 1-100/1-100/1-100 sccm, respectively;

forming a Si-containing conductive material atop said HfSiN film;

patterning said Si-containing conductive material, said HfSiN film and said stack into a patterned gate region; and annealing said Si-containing conductive material, said HfSiN film and said stack utilizing a first anneal in nitrogen at 1000° C., followed by a second anneal in a forming gas ambient at 450° C. to provide a gate stack structure in which the thickness of the interfacial layer is reduced and said gate stack has an equivalent oxide thickness of about 12 angstroms.

* * * * *